(12) United States Patent
Dasgupta et al.

(10) Patent No.: US 10,586,866 B2
(45) Date of Patent: Mar. 10, 2020

(54) STRESSORS FOR COMPRESSIVELY STRAINED GAN P-CHANNEL

(71) Applicant: INTEL CORPORATION, Santa Clara, CA (US)

(72) Inventors: Sansaptak Dasgupta, Hillsboro, OR (US); Marko Radosavljevic, Portland, OR (US); Han Wui Then, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/774,449

(22) PCT Filed: Dec. 9, 2015

(86) PCT No.: PCT/US2015/064742
§ 371 (c)(1),
(2) Date: May 8, 2018

(87) PCT Pub. No.: WO2017/099752
PCT Pub. Date: Jun. 15, 2017

(65) Prior Publication Data
US 2018/0331222 A1   Nov. 15, 2018

(51) Int. Cl.
*H01L 29/78* (2006.01)
*H01L 29/66* (2006.01)
*H01L 29/08* (2006.01)
*H01L 29/20* (2006.01)
*H01L 29/205* (2006.01)
(Continued)

(52) U.S. Cl.
CPC ...... *H01L 29/7848* (2013.01); *H01L 29/0847* (2013.01); *H01L 29/2003* (2013.01); *H01L 29/205* (2013.01); *H01L 29/24* (2013.01); *H01L 29/267* (2013.01); *H01L 29/66522* (2013.01)

(58) Field of Classification Search
CPC combination set(s) only.
See application file for complete search history.

(56) References Cited

U.S. PATENT DOCUMENTS

| | | |
|---|---|---|
| 7,649,232 B2 | 1/2010 | Tamura et al. |
| 8,072,031 B2 | 12/2011 | Shima |
| 8,895,396 B1 | 11/2014 | Fu et al. |

(Continued)

FOREIGN PATENT DOCUMENTS

WO   2017099752 A1   6/2017

OTHER PUBLICATIONS

International Search Report and Written Opinion received for PCT Application No. PCT/US2015/064742. dated Aug. 18, 2016. 15 pages.

(Continued)

*Primary Examiner* — Ratisha Mehta
(74) *Attorney, Agent, or Firm* — Finch & Maloney PLLC (57) ABSTRACT

Techniques are disclosed for increasing the performance of III-N p-channel devices, such as GaN p-channel transistors. Increased performance is obtained by applying compressive strain to the GaN p-channel. Compressive strain is applied to the GaN p-channel by epitaxially growing a source/drain material on or in the GaN. The source/drain material has a larger lattice constant than does the GaN and puts the p-channel under compressive strain. Numerous III-N material systems can be used.

22 Claims, 6 Drawing Sheets

(51) Int. Cl.
*H01L 29/24* (2006.01)
*H01L 29/267* (2006.01)

(56) References Cited

U.S. PATENT DOCUMENTS

| | | | |
|---|---|---|---|
| 2004/0010175 A1* | 1/2004 | Randolph | C07C 2/62 |
| | | | 585/708 |
| 2005/0275038 A1* | 12/2005 | Shih | H01L 29/78633 |
| | | | 257/382 |
| 2007/0202651 A1 | 8/2007 | Zhang et al. | |
| 2008/0283906 A1* | 11/2008 | Bohr | H01L 29/045 |
| | | | 257/327 |
| 2012/0261718 A1 | 10/2012 | Sosa Cortes et al. | |
| 2013/0017657 A1* | 1/2013 | Lee | H01L 21/28264 |
| | | | 438/285 |
| 2013/0264639 A1 | 10/2013 | Glass et al. | |
| 2013/0313655 A1 | 11/2013 | Wang et al. | |
| 2015/0243784 A1* | 8/2015 | Morin | H01L 29/7842 |
| | | | 257/348 |
| 2015/0357454 A1* | 12/2015 | Lutgen | H01L 29/7783 |
| | | | 257/76 |

OTHER PUBLICATIONS

International Preliminary Report on Patentability received for PCT Application No. PCT/US2015/064742. dated Jun. 12, 2018, 10 pages.
Sun, G., "Strain Effects on Hole Mobility of Silicon and Germanium P-Type Metal-Oxide-Semiconductor Field-Effect-Transistors." Dissertation presented to Graduate School of The University of Florida. 2007.141 pages.
"Electrical/Physical properties of GaN," retrieved from the Internet at http://www.ee.sc.edu/personal/faculty/simin/ELCT871/02 GaN Properties.pdf, on Nov. 23, 2015. 11 pages.
Khan,Asif, "CVD Deposition of Group-III Nitride Materials," retrieved from the internet at https://www.aps.org/units/fiap/meetings/presentations/upload/khan.pdf, on Nov. 12, 2015. 58 pages.
"Wurtzite polyhedra.png," Wikimedia Commons, the free media repository, Apr. 6, 2008. 4 pages.

* cited by examiner

STRESSORS FOR COMPRESSIVELY STRAINED GAN P-CHANNEL

BACKGROUND

Gallium nitride (GaN) materials and their III-N analogues show promise as integrated circuits materials. Due to their large bandgap and high mobility, these materials show particular promise for Power Management Integrated Circuits (PMIC), high-frequency and high-power applications.

As will be appreciated, the figures are not necessarily drawn to scale or intended to limit the present disclosure to the specific configurations shown. For instance, while some figures generally indicate straight lines, right angles, and smooth surfaces, an actual implementation of a transistor structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Structures, techniques and devices are disclosed that take advantage of altered properties of III-N (e.g., GaN, InN, AlN, and compounds thereof) p-channel devices whereby mobility is boosted by lifting the heavy hole/light hole degeneracy of the III-N material, and allowing transport to proceed through the light hole valley. Applications that require logic and controller circuits, for example, work best when high performance, low leakage p-channel devices are employed, but while n-channel performance of GaN is very good, the p-channel performance is relatively poor due to, for instance, poor conductivity and scalability. In one set of embodiments, the heavy hole/light hole degeneracy in III-N materials is promoted by applying compressive strain the III-N material. This compressive strain can be achieved, for instance, by incorporating a source/drain material having a larger lattice constant than the III-N material. The larger lattice constant source/drain material applies stress to the p-channel from opposing sides, applying uniaxial compression strain to the p-channel. The resulting compression strain in the channel improves hole mobility and, as a result, performance of the channel. Compression strain can increase mobility by a factor of greater than 10, greater than 100 or greater than 1000, according to some embodiments. The p-channel III-N devices described herein may be used in semiconductors such as compound semiconductors, metal oxide semiconductors (MOS), RF power amplifiers, transistors and voltage regulators.

General Overview

Gallium nitride (GaN) will be used as an example herein, but it should be understood that additional Group III-nitride (III-N) materials such as aluminum nitride (AlN) and indium nitride (InN) can realize similar benefits using the same or similar constructions or procedures. As used herein, III-N materials also include crystalline alloys that substitute a fraction of one post-transition metal (specifically column 13 of periodic table) for another. These materials include, for example, $Al_xGa_{(1-x)}N$, although numerous other suitable III-N compounds will be apparent in light of this disclosure. In some embodiments, the III-N materials exhibit a wurtzite crystalline structure. As previously explained, because they exhibit poor performance and high leakage, GaN p-channels would be of limited applicability in high performance applications that include, for example, logic and/or controller circuits. P-channels transport holes, as opposed to electrons, and for the purposes herein improved mobility refers to the mobility of holes being improved. Holes essentially represent absent electrons, and holes do exhibit mass. As described herein, performance of GaN p-channels is increased by improving hole mobility through altering the shape (e.g., steepening) of hole bands in GaN crystals (or other III-N compound). Because conductivity is inversionally proportional to the effective mass of the holes, if the slope of hole bands at lower energies can be increased, the effective mass of the holes being mobilized is reduced and the conductivity of the semiconductor can be significantly improved at low energy levels.

By applying uniaxial compressive strain to a GaN p-channel device according to an embodiment herein, it has been theoretically determined that two low energy heavy hole bands can be shape altered to effectively reduce mass and essentially become light hole bands. As the effective mass of a heavy hole is expected to be from five to ten times the effective mass of a light hole, the shift to less massive (steeper) hole bands at the lowest energy levels means that a greater number of holes can be mobilized resulting in greater performance at lower energy levels. In some cases, the conductivity can be increased by a factor of greater than 10 or greater than 100, or more, by compressively straining the p-channel portion of the GaN substrate. Strain can be measured in a GaN p-channel using methods, such as Raman scattering. Strain can be measured and reported as the percentage change in the length of the material along the strain axis. A decrease in length means that the material is compressively strained while an increase in length means that the material is in tension. Unless stated otherwise, the strain in a region is the average strain throughout that region. Strain can be applied along one, two or three axes. Some embodiments described herein take advantage of the effects of uniaxial strain, although biaxial strain can also be employed according to other embodiments.

One method of compressively straining a GaN p-channel device is to utilize a source/drain (SD) material having a larger lattice constant than the GaN p-channel material itself. By growing a source/drain material directly on the GaN, the crystal structures of the two materials interact to such a degree that each will stress the other due to the lattice mismatch. Because of the lattice mismatch and the strong bonds between the GaN crystal and the SD crystal, the SD material will apply an expansive force to the GaN and the GaN will apply a constrictive force to the SD material. The architecture of the device can take advantage of these forces and provide a GaN p-channel region that is permanently compressively strained. The amount of compressive strain in the GaN is a function of the stress applied by the SD material and can be controlled by several factors, including the composition and crystalline structure of the SD material, the ratio of the lattice constant of the SD material to that of the GaN, as well as the ratio of the length of the source and drain to the length of the gate. For example, a longer source or drain or a smaller p-channel length will result in greater strain in the p-channel. The lattice constant of the SD material and that of the GaN should not be so different that defects occur to a level that significantly reduces the conductivity at the SD/GaN interface. With the variation in lattice constant between the two materials, some level of defects is inevitable and to be expected. The lattice constant of GaN (3.189 Å (a) and 5.185 Å (c)) is smaller than that of many crystalline SD candidates materials, so based on lattice constant alone, a large pool of SD materials are available.

In addition to exhibiting a lattice constant greater than that of GaN, the SD material can have a band gap close to that of GaN and in some embodiments may have a valence band that extends below the valence band of GaN. The SD material can be conductive or semiconductive, as the case may be. Among the compositions that can be used as SD materials are oxides of transition metals and post-transition metals, according to some embodiments. These include, for example, indium tin oxide (ITO), titanium dioxide ($TiO_2$), hafnium dioxide ($HfO_2$), zirconium dioxide ($ZrO_2$), tin oxide ($SnO_2$), indium oxide ($In_2O_3$) and mixtures of these. In some embodiments, the SD materials used are conductive oxides such as ITO and $TiO_2$. In many embodiments the SD materials have lattice constants that are measurably greater than that of GaN. For example, the lattice constant (a) of the SD material may be greater than 4.0 Å, greater than 5.0 Å, greater than 6.0 Å, greater than 7.0 Å or greater than 8.0 Å. In some embodiments the lattice constant is greater than 10%, greater than 20%, greater than 50%, greater than 100% or greater than 200% larger than the lattice constant of the GaN (or other III-N material). The SD material may be grown on the GaN substrate using epitaxial techniques that can be used in conjunction with lithographic processes to produce III-N semiconductor devices.

The SD material may be doped prior to deposition, during deposition (in situ), or after deposition (ion implantation) to provide the desired polarity. The doping can be graded within the SD material. In one set of embodiments, a doped connector material can be positioned between the compressed GaN p-channel region and the SD material, e.g., ITO and/or $TiO_2$. The SD material itself may be undoped. In specific embodiments, the doped connector material can help to connect a relatively low conductivity SD material to the p-channel region of the compressively strained GaN. The doped material may provide a source of carriers that enables holes to move from the SD material to the doped material and then to the p-channel and then out through an analogous structure on the opposing side of the p-region of the strained GaN. In many cases, the doped connector material is selected from a material that is epitaxially compatible with the undoped GaN. For example, the doped connector material may have a lattice constant that is the same as GaN or that varies from that of GaN by, for example, less than 20%, less than 10% or less than 5%. In certain embodiments, the doped connector material is also epitaxially compatible with the SD material. In specific embodiments, the doped connector material can be p-doped GaN, and may be doped with, for example, an alkaline earth metal such as magnesium or a transition metal such as zinc. The doped connector material can be doped at any effective level, for example, in some embodiments, from $10^{19}$ cm$^{-3}$ to $5 \times 10^{20}$ cm$^{-3}$. The dopant type and concentration, as well as the doping profile, for the doped connector material can be customized as desired for a given target application or end use.

A doped connector material may be epitaxially grown on the undoped GaN and the SD material may then be grown on the layer of doped connector material. The same deposition techniques to those described herein for GaN can be used in various embodiments. The doped connector material may be a thin layer connecting the strained GaN to the SD material, and may have an average thickness of, for example, less than or equal to 20 nm, less than or equal to 10 nm or less than or equal to 5 nm. In some embodiments, a doped connector can serve one or more additional purposes such as decoupling the strain inducing SD material from the source of the carriers. While the compressively strained GaN can be effectively decoupled from the SD material by the doped connector material, the strain that results from the difference in lattice constant between the GaN and the SD material can still be induced through the doped connector material. Using the doped connector material as a bridge between the GaN and the SD material can provide for improved movement of holes while being able to utilize a relatively low conductivity material to apply strain to the p-channel region of the GaN.

While various example embodiments provided herein are discussed in terms of a GaN p-channel, other III-N p-channel devices can be implemented as well, wherein the SD material exhibits both a lattice constant greater than that of the III-N p-channel material, as well as a band gap close to that of the III-N p-channel material. In addition, in some example embodiments, the SD material may have a valence band that extends below the valence band of the III-N p-channel material. Numerous such configurations and variations will be apparent in light of this disclosure.

Architecture and Methodology

Figure 1A:
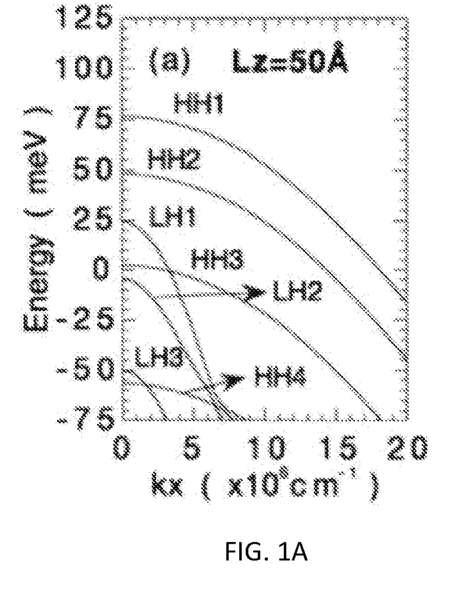
FIGS. 1A and 1B provide graphical results showing simulation studies designed to determine the light hole and heavy hole band effects that result from uniaxial compressive stress.
Figure 1B:
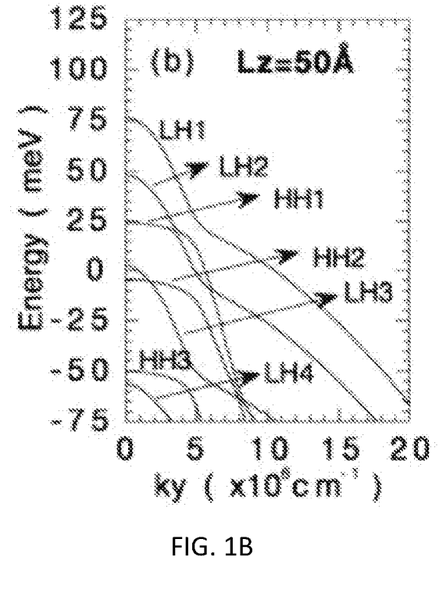

FIGS. 1A and 1B graphically display the valence subband structure of the wurtzite GaN single quantum well. FIG. 1A shows the subband structure with 1.0% uniaxial tensile strain along the $k_x$ direction while FIG. 1B shows the subband structure with 1.0% uniaxial tensile strain along the $k_y$ direction. Because the strain is tensile in the x-direction, and because the z-direction is fixed (due to size of the quantum well), the strain in the y-direction must be compressive. Thus the band structure in the $k_x$ direction is for uniaxial tensile strain, and in the $k_y$ direction for uniaxial compressive strain. The current is carried in the $k_y$ direction and the strain in the GaN only exhibits an effect when it is collinear with the direction of current. Thus, when the uniaxial strain is in the $k_x$ direction (FIG. 1A), there is no effect, and the simulation is the same as it would be for unstrained material. When there is compressive uniaxial strain in the $k_y$ direction (FIG. 1B), the enhanced mobility effects are realized. Therefore a comparison of the two graphs provides an accurate depiction of the changes that are effected by applying 1.0% compressive strain along $k_y$ to an unstrained (or strained other than along $k_y$) system.

As hole bands (not electron bands) are being investigated, the lowest energy levels are at the top of the graphs. The two lowest energy bands in FIG. 1A are HH1 and HH2, two heavy hole, gently sloped, parabolic bands at 75 and 50 meV at k=0. In FIG. 1B, the two lowest energy band minimums at k=0 have a much steeper slope and are considered light hole bands, labeled here as LH1 and LH2. This illustrates that the application of a 1.0% uniaxial compressive strain in the direction of current results in the re-shaping of two hole bands from heavy (minimal slope) to light (steep slope). In the functionally unstrained simulation of FIG. 1A, the two lowest energy bands would be heavy hole bands HH1 and HH2. As light holes have significantly lower effective mass than do heavy holes, the number of holes mobilized at the same energy level can be much greater under the strained condition (FIG. 1B) than in the unstrained condition (FIG. 1A). If a p-channel device can be constructed using GaN under this uniaxial compressive strain, the lower effective mass and reduced scattering can provide for better mobility and higher drive current for greatly improved performance. In many of the embodiments described herein, the III-N material strain is compressive and uniaxial in the $k_y$ direction. Biaxial strain is not generally necessary, but some architectures may exhibit at least some biaxial strain. In other embodiments, there is an absence of any strain, compressive or tensile, in any direction other than along a single axis.

The amount of strain in the III-N material can be quantified as a percentage of the change in the linear density of the atoms along the axis of strain. Compressive strain results in an increase in linear density while tensile strain results in a decrease. For example, 1.0% uniaxial compressive strain results in a 1% increase in the number of GaN units that fill a fixed distance along the axis of strain. A 1.0% uniaxial tensile strain results in a 1% decrease in the number of GaN units that fill a fixed distance along the axis of strain. Another way in which the strain can be described is that a 1.0% uniaxial compressive strain results in a 1% reduction in the linear distance occupied by a fixed number of GaN units. Similarly, 1.0% uniaxial tensile strain results in a 1% increase in the linear distance occupied by a fixed number of GaN units.

In one aspect of the present disclosure, strain is applied to the GaN p-channel by mismatching the GaN crystalline structure with a crystalline structure having a larger lattice constant. The larger lattice constant material can be used to form the source/drain material on the device. By forming bonds between the GaN and the crystals having a larger lattice constant, stress can be applied to the GaN that puts it in a compressive strained state. Conversely, stress is applied to the larger lattice crystals by the GaN, placing the larger lattice crystals in a tensile strained state. The larger lattice constant material can have a wurtzite crystalline structure and can form strong bonds with GaN crystals when grown epitaxially on the GaN. Excessive defects at the crystal interface between the GaN and the larger lattice constant material will reduce the stress that can be applied by the larger lattice constant material on the GaN. Therefore, in some embodiments, defects at the interface between the GaN and the larger lattice material are minimized.

Figure 2:
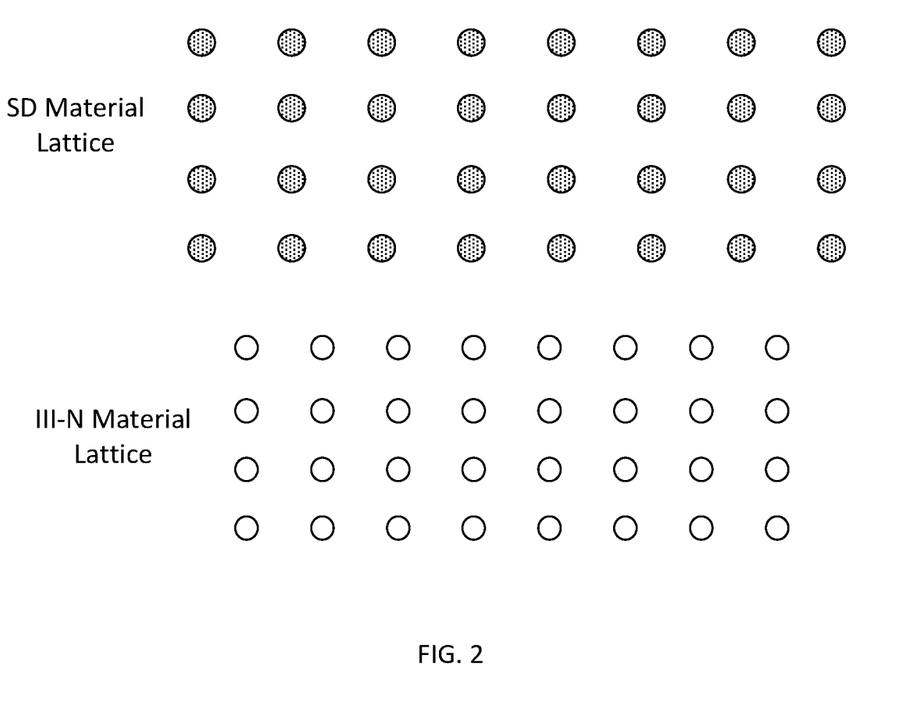
FIG. 2 provides a simplified diagram to illustrate the difference in lattice constant between two different crystalline materials.

FIG. 2 provides a schematic representation showing how the crystalline structure of the larger lattice constant SD material compares to the lattice constant of the III-N material (e.g., GaN) that it is being paired with. There is greater separation between the atoms in the SD material than in the III-N material, and if one were to superimpose one pattern over the other, the patterns would be mismatched.

Figure 3:
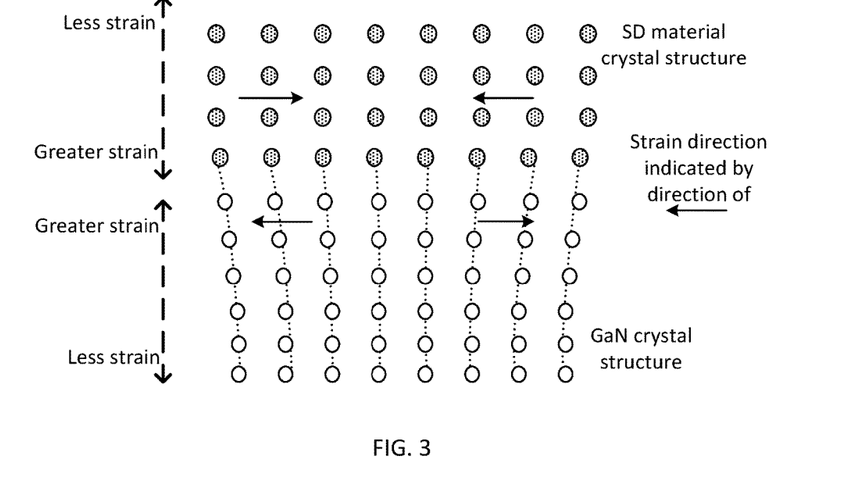
FIG. 3 illustrates schematically how the strain is distributed between two mismatched crystalline materials.

FIG. 3 schematically illustrates the hypothetical strain on two mismatched crystals when an SD crystal is epitaxially grown on, for example, GaN. The larger lattice structure of the SD crystal applies stress to the GaN crystal, pulling the atoms outwardly and putting the GaN in a tensile strain state. Conversely, the SD crystal atoms are pulled inward by the GaN and are compressively strained. The maximum strain is typically near the crystal interface, and the strain is reduced the farther the atoms are from the interface (upward or downward from the midline of FIG. 3).

Figure 4:
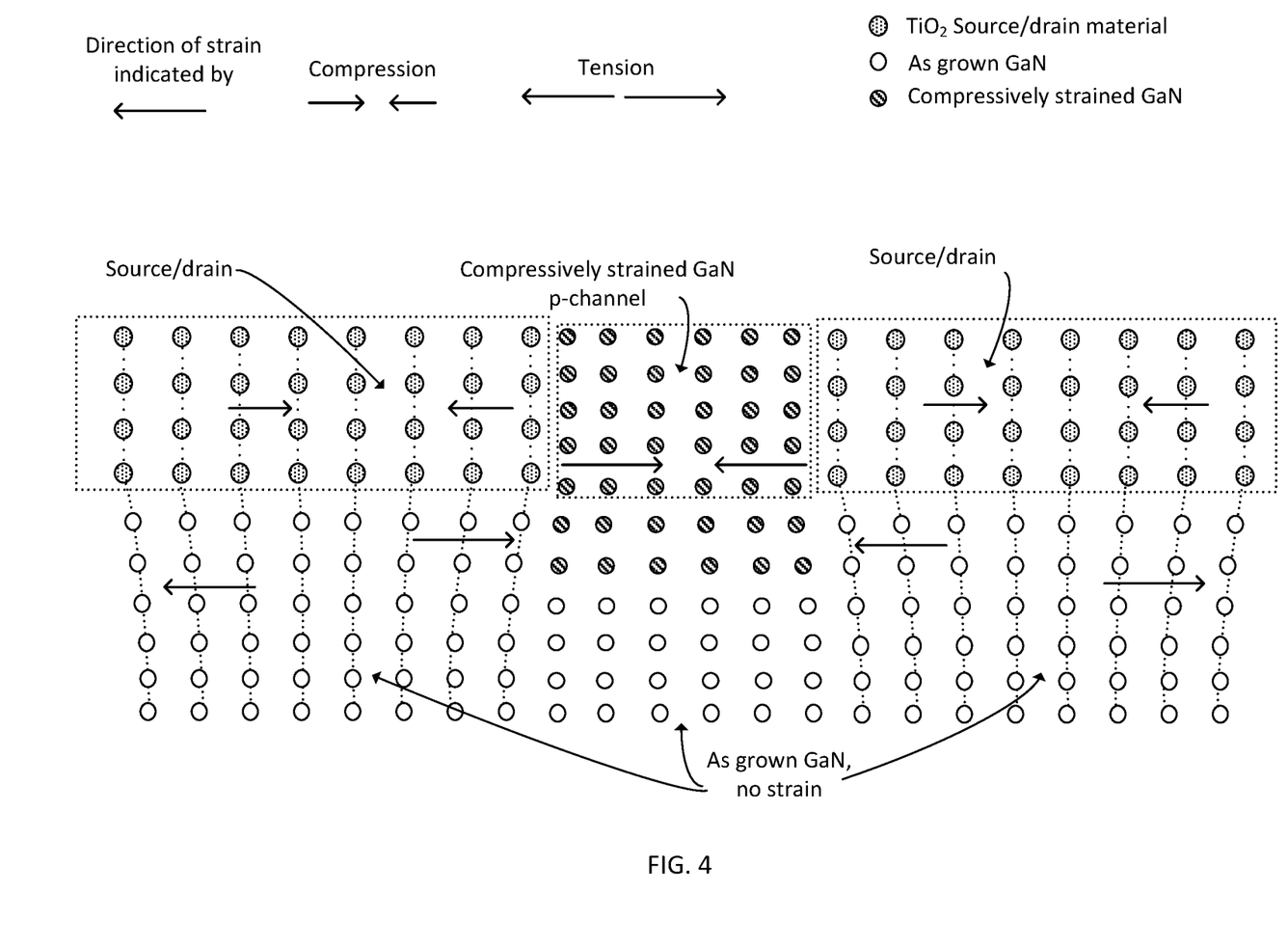
FIG. 4 provides a theoretical diagram illustrating the strain in different portions of an embodiment of a GaN p-channel device, according to an embodiment of the present disclosure.

FIG. 4 schematically illustrates the strain in different parts of a compressively strained p-channel device. The drawing is not to scale and is greatly simplified for clarification. It provides a theoretical view of a cross-section of an embodiment of a device similar to that provided in FIG. 6. In this embodiment, $TiO_2$ has been selected as the source/drain material. These structures are represented by the circles filled with dots. The GaN is represented either by empty circles (unstrained or in tension) or by the circles filled with diagonal stripes (compressively strained). The circles containing lighter shades of stripes are less strained. The GaN comprising the p-channel portion of the device is approximately indicated by the dotted rectangle surrounding the compressively strained GaN. The source and drain are also each roughly approximated by a dotted rectangle that surrounds the $TiO_2$ structures.

As explained below, in one set of embodiments, the GaN substrate is first grown and then recesses or cavities for the source/drain material are dry etched from the GaN substrate. After etching and prior to the deposition of the $TiO_2$, the GaN is as grown and unstrained—all of the GaN at this moment would be represented as empty circles. As the $TiO_2$ is epitaxially grown on the recesses in the GaN substrate, stress starts to develop between the two materials due to the lattice constant mismatch. The $TiO_2$ has a larger lattice structure than does GaN and is represented in FIG. 4 by the larger spacing between the $TiO_2$ structures than between the GaN structures. As the source/drain recesses fill in, a portion of the GaN below the recesses starts to be in tension. At the same time, the $TiO_2$ begins to become compressively strained due to the stress provided by the smaller lattice GaN. The GaN in the p-channel, however, is contained between the source and drain as the recesses fill. Due to the relatively long length of the source and drain in relation to the length (across the figure) of the p-channel portion, some of the compressive strain in the horizontal direction is transferred to the p-channel portion of the GaN, resulting in compressive strain in that particular portion. As explained elsewhere herein, the magnitude of the compressive strain can be controlled, at least partially, by the ratio of the source and drain length to the p-channel length. In various embodiments, the ratio of the length of the source or drain to the length of the p-channel portion can be greater than 0.5:1, greater than 1:1, greater than 2:1, greater than 5:1 or greater than 10:1.

For the purposes herein, lattice constant values are provided at 300° K. The lattice constants for GaN at this temperature are 3.189 Å (a) and 5.185 Å (b). Unless otherwise stated, lattice constant refers to the (a) lattice constant of the material being described. The ratio of the lattice constants of the SD material to the III-N material can be greater than 1.0 and in specific embodiments can be greater than or equal to 1.1, 1.2, 1.5, 2.0, 2.5 or 3.0. In some embodiments the (a) lattice constant of the larger lattice constant SD material can be, for example, greater than or equal to 3.2 Å, 3.5 Å, 3.8 Å, 4.0 Å, 4.5 Å, 5.0 Å, 7.0 Å, 9.0 Å or 10.0 Å.

Figure 5:
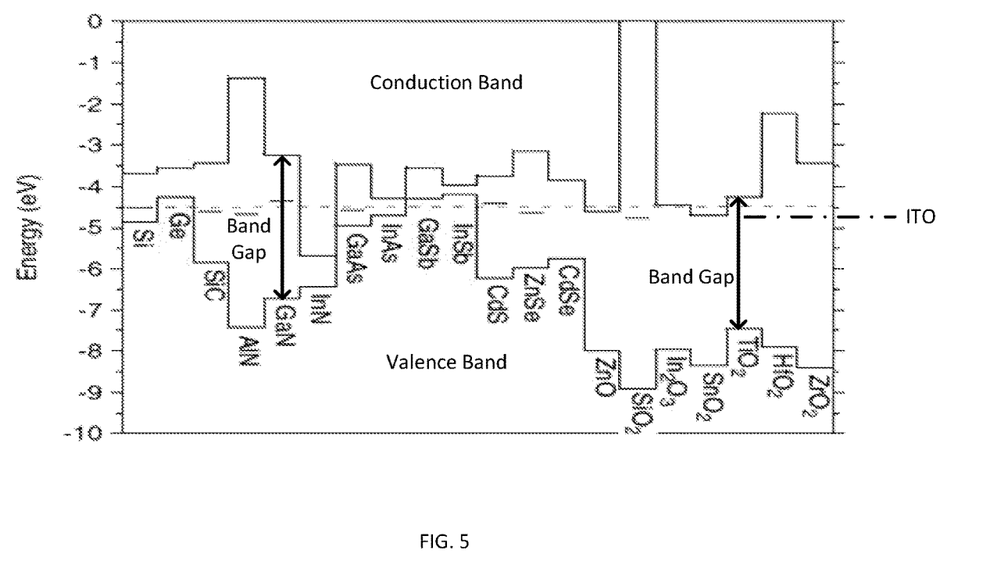
FIG. 5 is a bar graph illustrating the band gap of various crystalline materials.

The crystalline structure of the larger lattice constant material can be any structure capable of applying stress to the GaN. In some embodiments, the larger lattice constant material exhibits a wurtzite crystalline structure that matches the wurtzite structure of the III-N crystal. In addition to having an appropriate lattice constant, the SD material can have a band gap that closely matches that of GaN, or the particular III-N material that is being used. FIG. 5 illustrates the band alignments of some of the III-N materials as well as some of the candidate materials for the larger lattice constant source/drain material. Gallium nitride has a band gap of 3.44 eV. In many embodiments, the source/drain material comprises a material that has a band gap similar to that of GaN and the bottom of the valence band for the material is below that of GaN. In some embodiments, the source/drain material can have a band gap that is within the range of 3.44+/−0.1 eV, 3.44+/−0.2 eV, 3.44+/−0.3 eV, 3.44+/−0.4 eV or 3.44+/−0.5 eV. For example, as shown in FIG. 5, $TiO_2$, $SnO_2$ and $In_2O_3$ all exhibit band gaps of about 3.5 eV and have a valence band that is below the valence band of GaN. In some embodiments, the larger lattice constant source/drain material can be conductive and may be, for example, a degenerate semiconductor material. In some embodiments, the source/drain material is an oxide of a transition or post-transition metal. Indium tin oxide (ITO) exhibits a work function (WF) of 4.7 eV that is indicated by a solid line labeled "ITO" in FIG. 5. ITO has a band alignment close to GaN and a large lattice constant (~10.1 Å) and can be used to form source/drain features that provide good physical and electrical properties for applying compressive strain to GaN in a p-channel device. Graded $TiO_2$ offers similar band alignment along with a large lattice constant and can also be used to form appropriate source and drain features. P-type band engineering can be used to bridge the barrier between ITO and $TiO_2$. Mixtures of ITO and graded $TiO_2$ can also be used to match the band gap of the p-channel material.

Figure 6A:
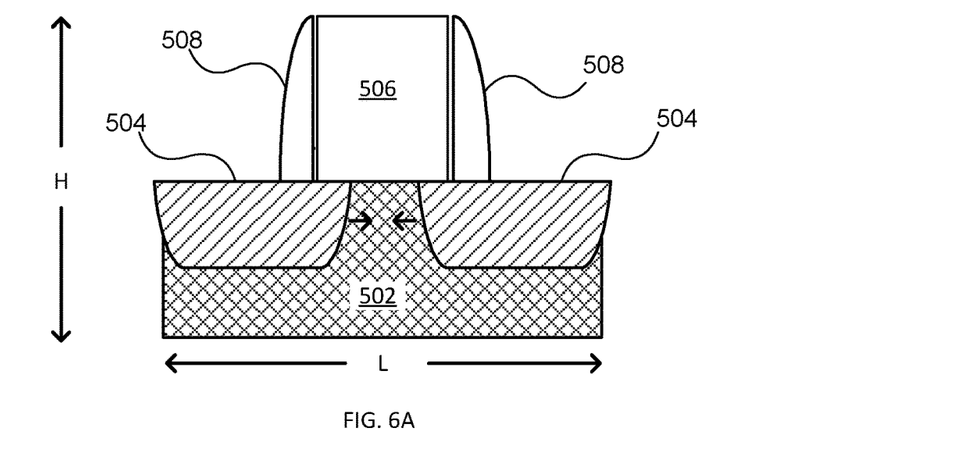
FIGS. 6A-6C provide cross-sectional views of three different embodiments of a p-channel device, according to the present disclosure.
Figure 6B:
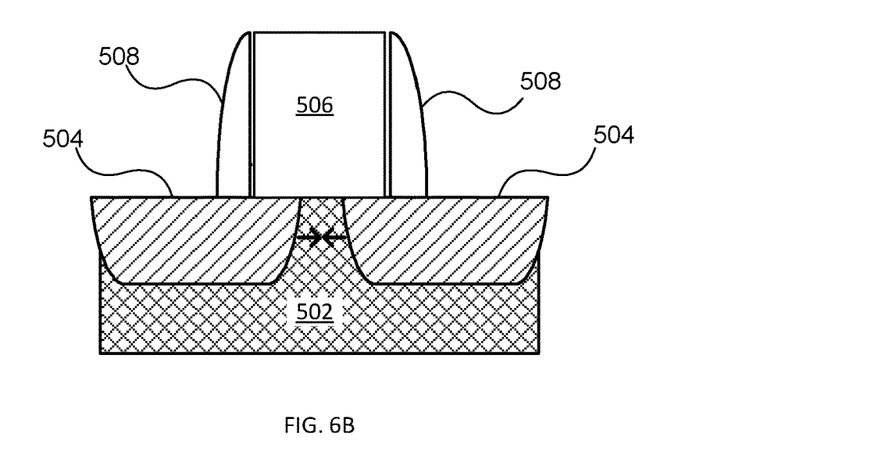
Figure 6C:
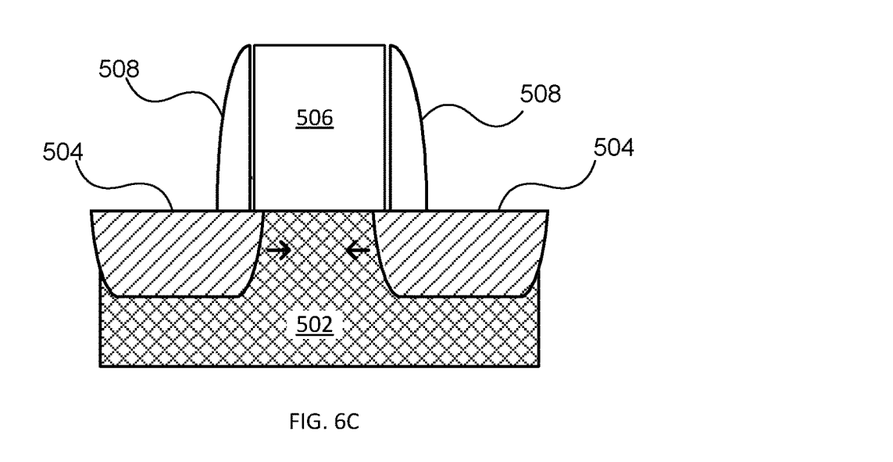

FIGS. 6A to 6C provide cross-sectional diagrams of a GaN p-channel device with resulting compressive strain in the channel to improve mobility and, as a result, the performance of the device. The compressive stress is applied by a source/drain which comprises ITO/graded $TiO_2$. The ITO/graded $TiO_2$ can be chosen due to its lattice constant and band width alignment. Note that the band width alignment can be band engineered by those of skill in the art to more carefully match that of the GaN. FIG. 6A shows GaN substrate 502 onto which ITO/graded $TiO_2$ source/drain portions 504 have been grown. The larger lattice constant of the source/drain portions 504 help to stress the GaN to 1.0% compressive strain in order to induce the change in hole band slope that is illustrated in FIG. 1. The two arrows pointing inwardly toward each other represent the 1.0% compressive strain that the channel portion is subjected to. Note that not all of the GaN substrate is in this same strain condition and that some portions of the GaN substrate 502 can be in a zero strain (as grown) or tensile strained condition. Gate 506 can be a conventional gate stack as known to those of skill in the art, such as an $AlO_2$ or $HfO_2$ metal gate. Spacers 508 are known to those of skill in the art and can comprise, for example, silicon nitride.

FIGS. 6B and 6C show the same construction as FIG. 6A except that the length of the GaN p-channel in relation to the source/drain has been altered. In FIG. 6B, the length of the GaN p-channel has been decreased, as evidenced by the shorter distance between the source and drain 504. This means that the expansive forces applied by source/drain 504 are operating on a shorter length of GaN and an equal force working on a smaller length of substrate is going to result in greater compressive strain over that length. For instance, hypothetically, if the p-channel device of FIG. 6A is at 1.0% compressive strain, then that of FIG. 6B might be at 1.5% compressive strain. Thus, the strain applied to the p-channel device can be altered, in at least some embodiments, by adjusting the relative size of the source/drain in comparison to the length of the portion of GaN that is between the source and drain. FIG. 6C illustrates a construction showing the opposite effect, where the distance between the source and drain has been expanded. In this case, the length of GaN that is subject to the force applied by the source/drain is greater, and therefore the amount of compression applied to the GaN per unit length is less than as shown in FIG. 6A. Hypothetically, the GaN portion positioned between the source/drain of the p-channel device of FIG. 6C might realize 0.5% compressive strain.

Figure 7:
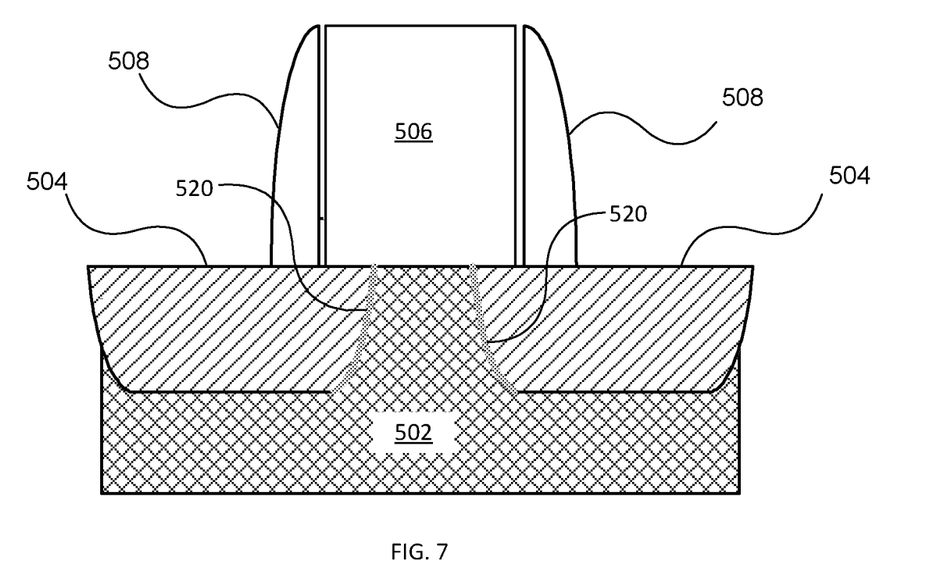
FIG. 7 provides a cross-section view of an embodiment of a p-channel device that includes a doped connector layer.

FIG. 7 provides a cross-sectional view of an embodiment similar to those of FIGS. 6A through 6C except that it includes a doped connector layer 520. Doped connector layer 520 can be a conductive material that allows for the inducement of strain in the GaN 502 due to the lattice mismatch between the GaN and the SD material 504. In the embodiment shown (not to scale), doped connector layer 520 is Mg-doped GaN. The Mg-doped GaN can be deposited onto the walls of the p-channel region of the GaN, which can be strained or unstrained when the doped connector layer 520 is deposited. In some cases, the Mg-doped GaN is deposited before the p-channel region is strained. For example, the Mg-doped material can be grown on the GaN to a thickness of about 5 nm. The SD material is still able to stress the undoped GaN so that it is compressively strained, as in the embodiments of FIGS. 6A-C. In some embodiments portions of the doped connector material can be etched away prior to the deposition of the SD material.

Method of Production

Devices incorporating compressively strained GaN (and other III-N materials) p-channels can be produced using the technique outlined in the flow chart of FIG. 7. The procedures shown may be done in a different order than shown, and specific procedures may be optional in some embodiments. Additional procedures may also be added.

In procedure 602 the GaN substrate is formed using a technique such as halide vapor phase epitaxy (HVPE) or chemical vapor deposition (CVD). In procedure 604 the upper surface of the GaN is then masked in the region of the p-channel and the source and drain regions are dry etched using techniques such as reactive ion etching (RIE). The mask layer may be formed using typical hard mask materials, such as such as silicon dioxide, silicon nitride, and/or other conventional dielectric materials. In procedure 605 an optional doped connector layer may be applied to the GaN substrate, or a portion thereof. The doped connector layer can be deposited on the substantially vertical sides (as shown in FIG. 7) of the GaN p-channel region using methods such as HVPE or CVD. After deposition, portions of the doped connector layer, such as on horizontal GaN surfaces, can be removed, such as by etching.

In procedure 606 the source and drain cavities are filled by epitaxially growing a source/drain material such as ITO, $TiO_2$ or a combination thereof. These materials may be grown using, for example, chemical vapor deposition (CVD), electron beam evaporator, or magnetron sputtering. In some embodiments, the source/drain material will be deposited on the doped connector layer. In other embodiments, the source/drain material is deposited directly on the undoped GaN or on both a region of undoped GaN and a doped connector layer region. As the source/drain material is grown, the lattice mismatch results in stress that compressively strains the GaN in the p-channel region in procedure 608. The length of the source and drain in relation to the p-channel region can be tuned to apply the desired uniaxial strain for a specific source/drain material. In procedure 610, a gate stack and spacers are formed on the p-channel to complete the p-channel device. The p-channel remains in its strained state after completion. In most embodiments, little or no strain is transferred to the gate stack or spacers.

Example System

Figure 8:
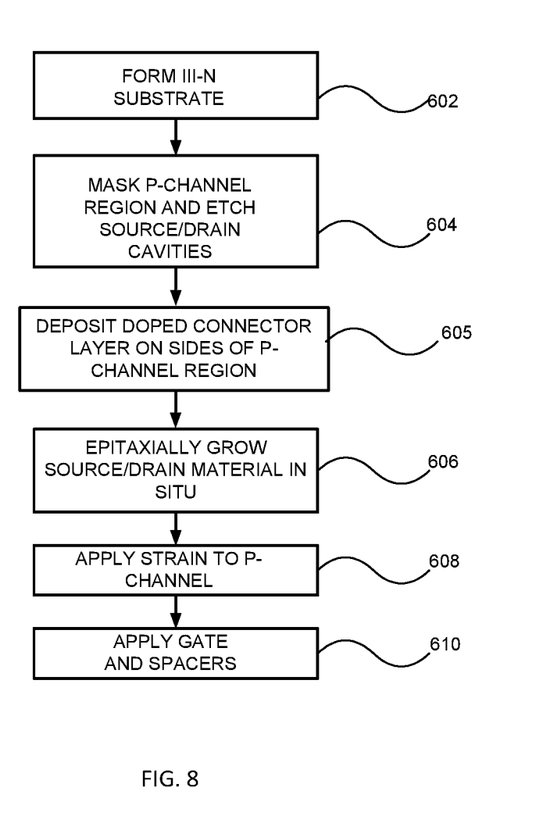
FIG. 8 is a flow chart illustrating one embodiment of a method for making a compressively strained GaN p-channel device, according to the present disclosure.
Figure 9:
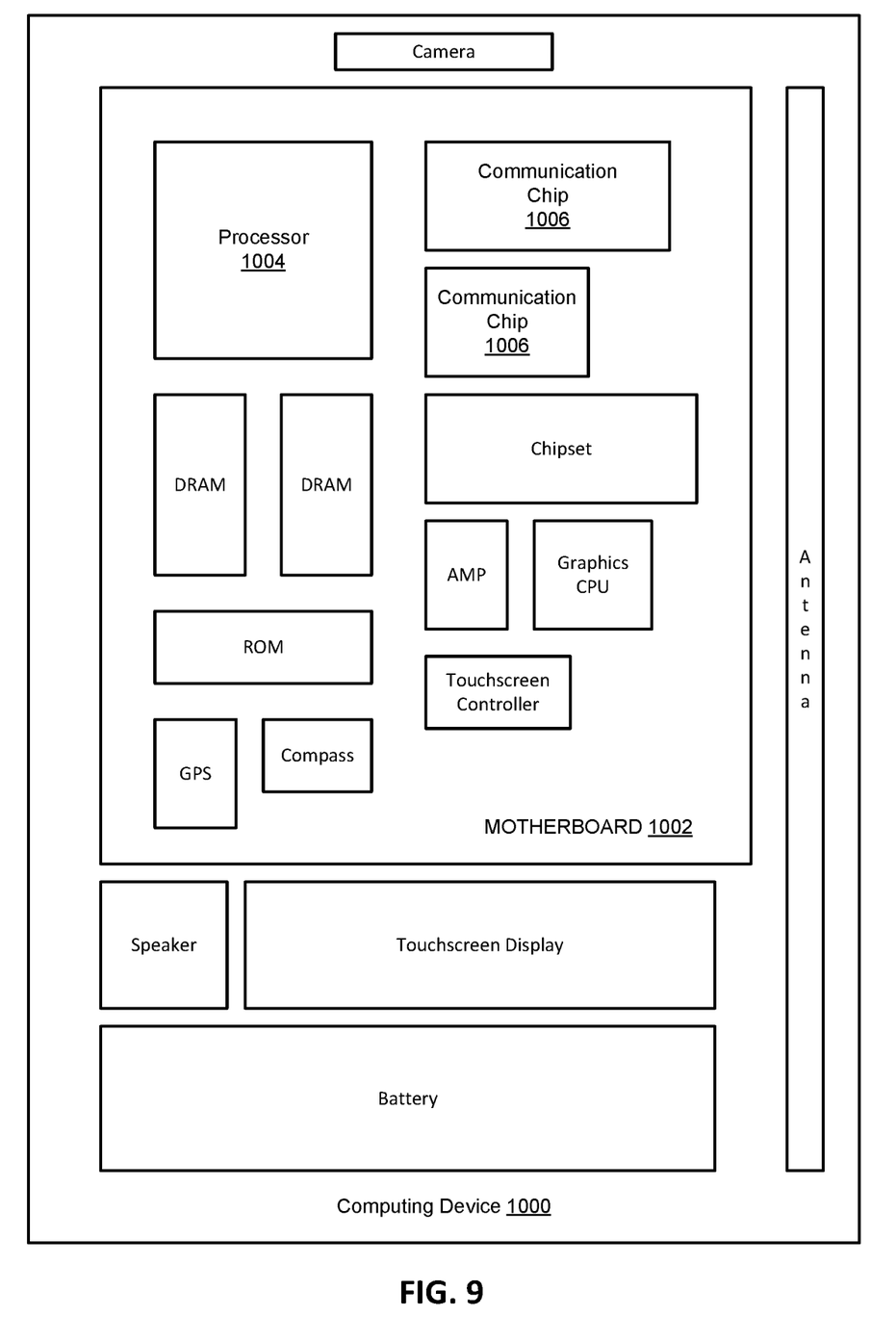
FIG. 9 illustrates a computing system implemented with one or more transistor structures in accordance with an example embodiment of the present disclosure.

FIG. 8 illustrates a computing device 1000 configured in accordance with one embodiment of the present disclosure. As can be seen, the computing device 1000 houses a motherboard 1002. The motherboard 1002 may include a number of components, including but not limited to a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of device 1000, etc. Depending on its applications, computing device 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing device 1000 may include one or more transistor structures as described herein. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some embodiments of the present disclosure, the integrated circuit die of the processor includes an onboard non-volatile memory or cache, and/or is otherwise communicatively coupled to off-chip memory that is implemented with one or more transistor structures as described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip includes one or more devices implemented with one or more transistor structures as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the device 1000 may be any other electronic device that processes data or employs transistors.

FURTHER EXAMPLE EMBODIMENTS

The following examples pertain to further embodiments, from which numerous permutations and configurations will be apparent.

Example 1 is a transistor device, the device comprising a substrate comprising a III-Nitride material having a first lattice constant, the substrate including a p-channel region; and source and drain regions on the substrate and adjacent to the channel region, the source and drain regions comprising a source/drain material having a second lattice constant wherein the second lattice constant is greater than the first lattice constant.

Example 2 includes the subject matter of Example 1 wherein the III-Nitride material is selected from at least one of GaN, AlN, InN and alloys thereof.

Example 3 includes the subject matter of Examples 1 and 2 wherein the source/drain material exhibits a band gap between 3.0 and 4.0 eV.

Example 4 includes the subject matter of any of the Examples described above wherein the source/drain material exhibits a band gap between 3.3 and 3.7 eV.

Example 5 includes the subject matter of any of the Examples described above wherein the source/drain material is conductive.

Example 6 includes the subject matter of any of the Examples described above wherein the source/drain material is selected from ITO, $TiO_2$ or a combination thereof.

Example 7 includes the subject matter of any of the Examples described above wherein the p-channel region is compressively strained.

Example 8 includes the subject matter of Example 7 wherein the compressive strain is uniaxial.

Example 9 includes the subject matter of any of Examples 7 and 8 wherein the strain is between 0.5 and 1.5%.

Example 10 includes the subject matter of any of the Examples described above wherein at least a portion of the substrate is unstrained.

Example 11 includes the subject matter of any of the Examples described above wherein the III-Nitride material is GaN.

Example 12 includes the subject matter of any of the Examples described above wherein the p-channel region comprises GaN and the source/drain material is selected from ITO, $TiO_2$ or a combination thereof.

Example 13 includes the subject matter of any of the Examples described above further comprising a doped connector layer positioned between the p-channel region of the III-N material and the source and drain regions.

Example 14 includes the subject matter of Example 13 wherein the doped connector layer comprises the III-Nitride material plus a dopant.

Example 15 includes the subject matter of Example 14 wherein the doped material is GaN doped with Mg or Zn.

Example 16 is an electronic device comprising a printed circuit board having one or more integrated circuits, wherein at least one of the one or more integrated circuits comprises one or more devices described in the preceding examples.

Example 17 is a transistor device, the device comprising a substrate having a p-channel region, the substrate comprising a material selected from a III-Nitride, a gate electrode above the p-channel region, and source and drain regions in the substrate and adjacent to the p-channel region, the source and drain regions each exhibiting a lattice constant greater than a lattice constant of the III-Nitride material.

Example 18 includes the subject matter of Example 17 wherein the III-Nitride is selected from AlN, GaN, InN or mixtures thereof.

Example 19 includes the subject matter of Examples 17 or 18 wherein the p-channel is compressively strained.

Example 20 includes the subject matter of any of Examples 17-20 wherein the source and drain regions are comprised of a source/drain material having a band gap that is within +/−0.5 eV of the band gap of the substrate material.

Example 21 includes the subject matter of any of Examples 17-20 wherein the p-channel region comprises GaN and the source/drain material is selected from ITO, $TiO_2$ or a combination thereof.

Example 22 includes the subject matter of any of Examples 17-21 wherein the III-N material and the source/drain material each exhibit wurtzite crystalline structure.

Example 23 includes the subject matter of any of Examples 17-22 wherein the p-channel region has a length, the source region has a length and the drain region has a length, and the ratio of the length of the source region plus the length of the drain region to the length of the p-channel region is greater than or equal to 0.5, 1, 2, 3, 5 or 10.

Example 24 includes the subject matter of any of Examples 17-23 wherein the substrate comprises a region that is unstrained.

Example 25 includes the subject matter of any of Examples 17-24 wherein a portion of the substrate is biaxially strained.

Example 26 includes the subject matter of any of Examples 17-25 wherein at least a portion of one of the source or drain regions is strained in compression or tension.

Example 27 includes the subject matter of any of Examples 17-26 wherein the p-channel is strained greater than 0.2%, greater than 0.5%, greater than 1.0%, greater than 1.5% or greater than 2.0%.

Example 28 includes the subject matter of any of Examples 17-27 further comprising a doped connector layer positioned between the p-channel region of the III-N material and the source and drain regions.

Example 29 includes the subject matter of Example 28 wherein the doped connector layer comprises the III-Nitride material plus a dopant.

Example 30 includes the subject matter of Example 29 wherein the doped material is GaN doped with Mg or Zn.

Example 31 is a method for forming a transistor device, the method comprising forming at least two cavities in a substrate material, the substrate material comprised of at least one of AlN, GaN, InN and alloys thereof, forming a source and drain in the cavities by growing a crystalline material in the cavities, the source and drain defining a p-channel region in the substrate, and the crystalline material having a lattice constant greater than the lattice constant of the substrate material; and reducing effective hole mass in the p-channel region.

Example 32 includes the procedures of Example 31 wherein the cavities are formed using a dry etch process.

Example 33 includes the procedures of Examples 31 or 32 the crystalline material is formed via epitaxial growth.

Example 34 includes the procedures of any of Examples 31-33 wherein applying uniaxial strain to the p-channel region results in a compression of the p-channel region in the direction of current flow.

Example 35 includes the procedures of any of Examples 31-34 further comprising forming a gate and spacers on the p-channel region after the p-channel region has been strained.

Example 36 includes the procedures of any of Examples 31-35 wherein applying uniaxial strain to the p-channel region via a lattice constant mismatch between the crystalline material and the substrate material includes forming source and drain regions on respective sides of channel region.

Example 37 includes the procedures of any of Examples 31-36 wherein the p-channel region comprises GaN and the source/drain material is selected from ITO, $TiO_2$ or a combination thereof.

Example 38 includes the procedures of any of Examples 31-37 wherein the p-channel region comprises GaN and the substrate material is selected from ITO, $TiO_2$ or a combination thereof.

Example 39 includes the procedures of any of Examples 31-38 further comprising forming a doped connector layer between the p-channel region and the source and drain.

Example 40 includes the procedures of any of Examples 31-39 comprising applying uniaxial strain to the p-channel region.

Example 41 is a transistor device, the device comprising a substrate having a p-channel region, the substrate comprising a material selected from a III-Nitride, a gate electrode above the p-channel region, and source and drain regions in the substrate and adjacent to the p-channel region, the p-channel region being compressively strained by at least 0.1%.

Example 42 includes the subject matter of Example 41 wherein the III-Nitride is selected from AlN, GaN, InN or mixtures thereof.

Example 43 includes the subject matter of Examples 41 or 42 wherein the p-channel is compressively strained at least 0.5%.

Example 44 includes the subject matter of any of Examples 41-43 wherein the source and drain regions are comprised of a source/drain material having a lattice constant greater than that of the substrate material and a band gap that is within +/−0.5 eV of the band gap of the substrate material.

Example 45 includes the subject matter of any of Examples 41-44 wherein the p-channel region comprises GaN and the source/drain material is selected from ITO, $TiO_2$ or a combination thereof.

Example 46 includes the subject matter of any of Examples 41-45 wherein the III-N material and the source/drain material each exhibit wurtzite crystalline structure.

Example 47 includes the subject matter of any of Examples 41-46 wherein the p-channel region has a length, the source region has a length and the drain region has a length, and the ratio of the length of the source region plus the length of the drain region to the length of the p-channel region is greater than or equal to 0.5, 1, 2, 3, 5 or 10.

Example 48 includes the subject matter of any of Examples 41-47 wherein the substrate comprises a region that is unstrained.

Example 49 includes the subject matter of any of Examples 41-48 wherein a portion of the substrate is biaxially strained.

Example 50 includes the subject matter of any of Examples 41-49 wherein at least a portion of one of the source or drain regions is strained in compression or tension.

Example 51 includes the subject matter of any of Examples 41-50 wherein the p-channel is strained greater than 0.1%, greater than 0.2%, greater than 0.5%, greater than 1.0%, greater than 1.5% or greater than 2.0%.

Example 52 includes the subject matter of any of Examples 41-51 further comprising a doped connector layer positioned between the p-channel region of the III-N material and the source and drain regions.

Example 54 includes the subject matter of Example 52 wherein the doped connector layer comprises the III-Nitride material plus a dopant.

Example 55 includes the subject matter of Example 53 wherein the doped material is GaN doped with Mg or Zn.

Numerous embodiments will be apparent in light of this disclosure, and features described herein can be combined in any number of configurations.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit device, comprising:
   a substrate comprising a III-Nitride structure having a first lattice constant; and
   a source region, a drain region, and a region between the source and drain regions configured to act as a p-channel, the source and drain regions on the substrate and comprising corresponding structures having a second lattice constant wherein the second lattice constant is greater than the first lattice constant, the corresponding structures comprising oxygen, indium, tin, and titanium.

2. The device of claim 1 wherein the III-Nitride structure comprises nitrogen and at least one of gallium, aluminum, and indium.

3. The device of claim 1 wherein the source and drain structures exhibit a band gap between 3.0 and 4.0 eV.

4. The device of claim 1 wherein the source and drain structures exhibit a band gap between 3.3 and 3.7 eV.

5. The device of claim 1 wherein the region between the source and drain regions is compressively strained.

6. The device of claim 5 wherein the compressive strain is uniaxial.

7. The device of claim 5 wherein the strain is between 0.5 and 1.5%.

8. The device of claim 1 comprising a doped connector layer between the region between the source and drain regions, and one or both of the source and drain regions.

9. The device of claim 1 wherein the III-Nitride structure is gallium nitride (GaN).

10. The device of claim 1 wherein the region between the source and drain regions comprises gallium nitride (GaN).

11. The device of claim 1 wherein the source and the drain structures comprise indium tin oxide (ITO) and titanium dioxide ($TiO_2$).

12. The device of claim 1 wherein the source and the drain structures comprise titanium dioxide ($TiO_2$) graded to indium tin oxide (ITO).

13. The device of claim 1 wherein the source and the drain structures comprise titanium dioxide ($TiO_2$), indium oxide ($In_2O_3$), and indium tin oxide (ITO).

14. An integrated circuit device, comprising:
   a substrate comprising a III-Nitride structure;
   a source region, a drain region, and a region between the source and drain regions configured to act as a p-channel each on the substrate, the source and drain regions comprising a structure having a lattice constant greater than a lattice constant of the III-Nitride structure, the source/drain structure comprising oxygen, indium, tin, and titanium; and
   a gate electrode above the region between the source and drain regions;
   wherein the region between the source and drain regions is compressively strained.

15. The device of claim 14 wherein the III-Nitride structure comprises aluminum nitride (AlN), gallium nitride (GaN), indium nitride (InN), or mixtures thereof.

16. The device of claim 14 wherein the region between the source and drain regions comprises gallium nitride (GaN).

17. The device of claim 14 wherein the III-N structure and the source/drain structure each exhibit wurtzite crystalline structure.

18. The device of claim 14 wherein the region between the source and drain regions has a first length, the source region has a second length and the drain region has a third length, and the ratio of the second length of the source region plus the third length of the drain region to the first length of the region between the source and drain regions is greater than or equal to 1.

19. The device of claim 14 wherein the substrate comprises a region that is unstrained, and another region of the substrate is biaxially strained.

20. The device of claim 14 comprising a doped connector layer between the region between the source and drain regions of the III-Nitride structure and the source and drain regions.

21. A method for forming an integrated circuit device, the method comprising:
- forming at least two cavities in a substrate structure, the substrate structure comprised of at least one of aluminum nitride (AlN), gallium nitride (GaN), indium nitride (InN), and alloys thereof;
- forming a source and drain in the cavities by growing a crystalline structure in the cavities, the source and drain defining a region therebetween configured to act as a p-channel in the substrate, and the crystalline structure having a lattice constant greater than the lattice constant of the substrate structure, the crystalline structure comprising oxygen, indium, tin, and titanium; and
- reducing effective hole mass in the region between the source and drain regions.

22. The method of claim 21 further comprising applying uniaxial strain to the region between the source and drain regions.

* * * * *